United States Patent [19]

Beyer et al.

[11] 4,333,794
[45] Jun. 8, 1982

[54] OMISSION OF THICK Si₃N₄ LAYERS IN ISA SCHEMES

[75] Inventors: Klaus D. Beyer; Joseph S. Logan, both of Poughkeepsie, N.Y.

[73] Assignee: International Business Machines Corporation, Armonk, N.Y.

[21] Appl. No.: 251,698

[22] Filed: Apr. 7, 1981

[51] Int. Cl.³ .................. H01L 21/306; H01L 21/312
[52] U.S. Cl. ...................... 156/648; 29/571; 29/580; 148/175; 148/187; 156/643; 156/653; 156/659.1; 156/662; 357/43
[58] Field of Search .................. 148/1.5, 175, 187; 29/571, 580; 156/643, 646, 648, 649, 653, 657, 659.1, 661.1, 662, 628; 427/89; 357/40, 42, 43, 49, 50, 54; 430/319

[56] References Cited

U.S. PATENT DOCUMENTS

| | | | |
|---|---|---|---|
| 4,135,954 | 6/1979 | Chang et al. | 156/662 X |
| 4,142,926 | 3/1979 | Morgan | 148/187 |
| 4,209,349 | 6/1980 | Ho et al. | 148/187 |
| 4,252,579 | 2/1981 | Ho et al. | 148/174 |

*Primary Examiner*—William A. Powell
*Attorney, Agent, or Firm*—Sughrue, Mion, Zinn, Macpeak and Seas

[57] ABSTRACT

The present invention provides a process which comprises:
 (a) producing an ion-implantation resistant island on a substrate;
 (b) growing ion-implantation resistant sidewalls on the island;
 (c) implanting a first impurity;
 (d) removing the sidewalls;
 (e) implanting a second impurity where the sidewalls were;
 (f) growing a conformal etchable coating over the surface of the device;
 (g) masking to define an area spaced from and exterior to the area where the sidewalls were;
 (h) removing the conformal etchable coating in the area of step (g);
 (i) etching a deep trench in the area where the conformal coating was removed;
 (j) implanting a third impurity into the deep trench.

Following island removal, the emitter and base of a bipolar transistor are formed in the area where the island existed.

10 Claims, 18 Drawing Figures

OMISSION OF THICK Si₃N₄ LAYERS IN ISA SCHEMES

BACKGROUND OF THE INVENTION

1. Field of the Invention

The present invention relates to a process for fabricating semiconductor devices wherein extremely high precision on the location of device components is maintained.

2. Development of the Invention

In current large scale integration (LSI) processing techniques for forming, e.g., bipolar transistors, emitter and isolation formation is performed using two separate photolithographic steps. In electron beam lithography, for example, to maintain a 1 micron space between device components, an inherent alignment error of ±0.4 microns with respect to electron beam alignment marks exists with current state of the art technology. Thus, when two alignments are performed, for example one for emitter alignment and one for isolation alignment, a potential error of as great as 0.8 microns can occur. Using current photolithographic techniques, 1.5μ spacings can be obtained with an alignment error of ±0.6μ. In such a situation, using current state of the art technology, the possibility thus exists that the emitter-base junction and isolation will be too close or, alternatively, one or more of these device elements will overlap with one or more other device elements, leading to poor device performance. A further problem is that if the emitter-base junction and isolation are extremely close, i.e., there is high alignment error, high mechanical stresses present near the isolation region after high temperature heat treatments can impact on device performance.

Figure 1:
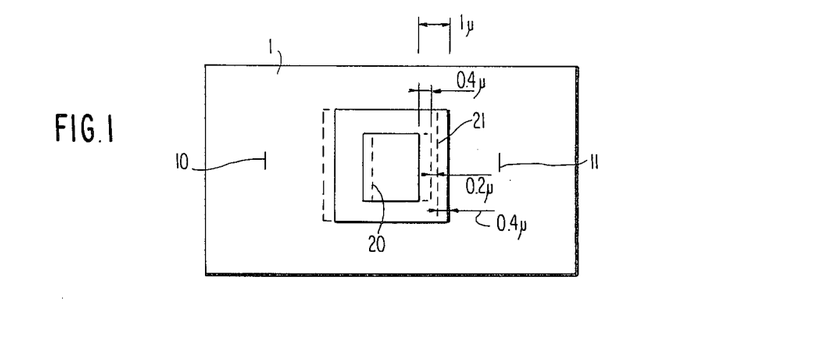
FIGS. 1–17 schematically illustrate a processing sequence in accordance with the present invention.

The above situation is illustrated in simplified form in FIG. 1 where substrate 1 is provided with electron beam registration marks 10 and 11 and there is shown emitter 20 and isolation trench 21 in perfect alignment as illustrated by the solid line; however, as illustrated by the broken lines, if emitter 20 is misaligned 0.4 microns to the right and isolation trench 21 is misaligned 0.4 microns to the left, the space separating these two device elements is only 0.2 microns.

U.S. Pat. No. 4,131,497 Feng et al discloses a method of manufacturing self-aligned semiconductor devices. However, in Feng et al there is no isolation/base alignment or emitter alignment as per the present invention; further, emitter size can vary substantially without accurate control, a factor in distinction to the present invention.

U.S. Pat. No. 4,135,954 Chang et al discloses a method for fabricating self-aligned semiconductor devices utilizing selectively etchable masking layers. However, according to the procedure of Chang et al, there is no self-alignment of the emitter and base or alignment with respect to the isolation.

U.S. Pat. No. 4,160,991 Anantha et al discloses a high performance bipolar device and a method for making the same. As with the preceding references, Anantha et al does not disclose a process which would permit isolation/emitter self-alignment.

BRIEF DESCRIPTION OF THE DRAWINGS

The Figures, of course, merely illustrate one small greatly enlarged portion of a silicon body which will be used to form a very dense bipolar integrated circuit and are not drawn to scale.

SUMMARY OF THE INVENTION

The present invention provides a process for manufacturing high density integrated circuits where transistor emitter-base isolation distances are established with high precision and, if there is any misalignment during photolithographic procedures, such misalignment occurs in a wide dielectric isolation without adverse impact on transistor performance.

The present invention provides a process which comprises:

(a) producing an ion-implantation resistant island on a substrate;

(b) growing ion-implantation resistant sidewalls on the island;

(c) implanting a first impurity;

(d) removing the sidewalls;

(e) implanting a second impurity where the sidewalls were;

(f) growing a conformal etchable coating over the surface of the device;

(g) masking to define an area spaced from and exterior to the area where the sidewalls were;

(h) removing the conformal etchable coating in the area of step (g);

(i) etching a deep trench in the area where the conformal coating was removed;

(j) implanting a third impurity into the deep trench.

Following island removal, the emitter and base of a bipolar transistor are formed in the area where the island existed.

In a preferred embodiment, trenches of various depths are etched into the substrate and filled with a dielectric isolation material.

DESCRIPTION OF THE PREFERRED EMBODIMENTS

For brevity, the following abbreviations are used in the followng discussion and in the Figures:

Polysi—polysilicon layer
SiO₂—silicon dioxide
Si₃N₄—silicon nitride
RIE—conventional reactive ion etching
CVD SiO₂—SiO₂ formed by conventional chemical vapor deposition.

In the following, like numerals denote like elements, though the drawings are not to scale.

While in the following doping is typically by ion implantation, it will be appreciated by one skilled in the art that either thermal diffusion or ion implantation can be used.

Reactive ion etching as is utilized in the present invention is described in detail in "A Survey of Plasma-Etching Processes" by Richard L. Bersin, published in Solid State Technology, May 1976, pages 31–36 in great detail. As will be appreciated by one skilled in the art, the atmospheres utilized for RIE will vary greatly depending upon the material being etched, and the Bersin article describes such in detail and is incorporated herein by reference. See also "Reactive Ion Etching in Chorinated Plasma" by Geraldine C. Schwartz et al, Solid State Technology, November 1980, pp. 85-91, also incorporated by reference.

Finally, while in the following certain specific P− type and N− type impurities are utilized for illustrative purposes, it will be appreciated by one skilled in the art that these are selected solely for illustrative purposes and other equivalent P− type and N− impurities can be used with equal success.

In the following disclosure, various layers are formed or removed. Unless otherwise indicated, the layers are formed or removed at the following conditions; where layer thicknesses vary, the processing time is merely increased or shortened to obtain or remove thicker or thinner layers, respectively.

Illustrative conditions used to form or remove various layers, illustrative implantation conditions, thermal oxidation conditions and photoresists are set forth below, all of which are conventional unless otherwise indicated. The disclosure below applies in general to the following processing scheme, but it will be apparent to one skilled in the art that other conditions and techniques can be used to achieve the desired result.

For instance, the epi layer is typically formed at 1,000° to 1,200° C. by deposition from an $SiCl_4/H_2$ atmosphere; or $SiH_4/H_2$ mixture; the epi layer is removed at room temperature by RIE etching in $SF_6$, $CCl_4$ or Cl-Ar mixture at room temperature.

Polysi layers are typically formed by CVD in a silane-argon atmosphere at 625° C.

$Si_3N_4$ is typically grown from a silane-ammonia atmosphere at 800° C.

$SiO_2$ can be grown by wet oxidation in steam at temperatures below 1000° C. or by CVD at low pressure, e.g., 500~700 millitorr and low temperatures, e.g., 400°~550° C. in a silane —$O_2$ atmosphere or at high temperatures, e.g., 700°~900° C. in a dichlorosilane atmosphere.

The photoresists used include conventional photoresists such as Shipley AZ 1350J which is commercially available from Shipley Co. and developable in a KOH solution. Such can be masked, exposed and developed in a conventional manner. Photoresists capable of fine resolution are preferred. Photoresists can be stripped in an $O_2$ plasma etch.

The above article by Bersin, of course, describes useful RIE techniques. Typically, RIE or directional etches are conducted as follows;

For $SiO_2$ in $CF_4-H_2$ at room temperature; see also L. Ephrath, Abstracts of the Electrochemical Society No. 135, Vol. 77-2, Fall Meeting, Atlanta, Ga., Oct. 9-14, 1977 and U.S. Pat. No. 3,940,506 Heinecke, both incorporated by reference;

For $Si_3N_4$ in $CF_4—H_2$ at room temperature; and

For polysi in $SF_6$ of $Cl_2/Ar$ mixtures or in $CBrF_3$ at room temperature. Electrochemical Society Meeting, Los Angeles, California, 14-19, 1979, extended Abstracts, Vol. 79-2, pp 1424-1525 describes the $SF_6$ RIE of polysilicon in some detail and such is incorporated by reference.

$Si_3N_4$ can also be removed by a wet etch in hot phosphoric acid at 160° to 180° C. and CVD $SiO_2$ can also be removed in buffered HF at room temperature.

Finally, boron implantation and arsenic implantations are typically conducted at 5 KeV for boron to a concentration of $2 \times 10^{14}$ atoms/cm$^2$ and for arsenic at 30 KeV to a concentration of about $2 \times 10^{15}$/cm$^2$.

Using the various etches above disclosed, generally an etch ratio on the order of 6~10:1, more typically 8:1, is obtained between polysi as compared to Si on $SiO_2$ using $SF_6$ RIE or $CBrF_3$ RIE and 6:1 using $Cl_2/Ar$ RIE. In a similar fashion, an etch ratio on the order to 15:1~20:1 is obtained for $SiO_2$ or $Si_3N_4$ as compared to Si or polysi with $CF_4—H_2$ RIE. Finally, $O_2$ plasma etching permits the rapid removal of photoresist and polyimide but does not affect $SiO_2$, $Si_3N_4$, etc.

In the processing scheme to be described, generally thickness and etching tolerances of plus or minus 10% are achieved.

Figure 2:
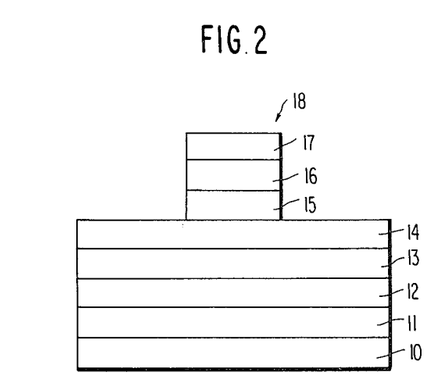

With reference to FIG. 2, there is shown therein substrate 10. The substrate is typically a <100> monocrystalline silicon wafer having a resistance on the order of 10 to 20 ohm-cm. Substrate 10 carries a conventional N epi layer 11 formed as above to a thickness of about 1 micron, 1,000 Å polysi layer 12 formed by CVD silane-argon deposition (which layer is undoped), 300 Å $Si_3N_4$ 13 formed by silane/ammonia deposition, 2,500 Å polysi layer 14 formed by a CVD silane-argon process (undoped), and what may be viewed as an "emitter island" 18 on polysi layer 14 comprising 1,000 Å $Si_3N_4$ layer 15, 10,000-12,000 Å CVD $Si_2O$ layer 16 (which is doped, for reasons later explained) and 1,000-1,500 Å polysi layer 17.

For purposes of simplicity, not shown in FIG. 2 or in subsequent Figures relating thereto is a conventional N+ subcollector which is formed by ion implantation of arsenic at 50 KeV and a dose of $1.5 \times 10^{16}$ atoms/cm$^2$ into substrate 10. During the epitaxial deposition process, which is a high temperature process, the subcollector region (not shown) will diffuse, but this effect is well known and the effect of such diffusion can be accurately predicted by one skilled in the art.

While not illustrated, the "island" 18 comprising layers 15, 16 and 17 as shown in FIG. 2 is formed as follows.

Beginning with a structure formed as shown in FIG. 2 up to and including 2,500 Å polysi layer 14, firstly an $Si_3N_4$ layer about 1,000 Å thick is deposited over the complete surface of polysi layer 14 by silane/ammonia deposition. After further processing as below, this will yield layer 15 of island 18.

Nextly, a CVD $SiO_2$ layer about 10,000-12,000 Å thick is grown on the 1,000 Å thick $Si_3N_4$ layer by a conventional CVD silane/argon process. This CVD $SiO_2$ layer is doped with germanium or boron to a concentration on the order of $2.5 \times 10^{21}$ atoms/cc by the addition of, for example, $GeH_4$. See Abe et al, Supplement to the Journal of the Japan Society of Applied Physics, Vol. 39, 1970, p. 88-93. Boron provides a similar effect; Schwenker, J. Electrochem. Soc.; Solid State Science, Vol. 118, No. 2, February 1971, p. 313-317. After processing as below, the remainder of this layer will form that portion of island 18 represented by CVD $SiO_2$ layer 16.

Following the above procedure, a layer of polysi approximately 1,200 Å thick is grown on the CVD $SiO_2$ layer 16. After processing as below, the 1,100 Å remainder of this layer will provide polysi layer 17 in island 18.

After the above procedure, a 300 Å thick $Si_3N_4$ layer is grown on the 1,200 Å polysi layer by silane/ammonia deposition. This $Si_3N_4$ layer serves as a temporary mask and will not be present in the device as shown at the stage of FIG. 2.

Thereafter, Shipley AZ 1350 J is applied to the uppermost $Si_3N_4$ layer, and the same is masked, exposed and developed (removed) where the island 18 is to be formed.

After the removal of the photoresist over the island location, the 300 Å $Si_3N_4$ layer directly thereunder is removed in the island location by RIE etch in $CF_4 H_2$ at room temperature; alternatively, a wet etch in hot phosphoric acid can be used, but this is not preferred.

By the above procedure, the 1,200 Å polysi layer which will yield layer 17 of island 18 is exposed.

The photoresist is next removed in a conventional manner by an $O_2$ plasma etch and thereafter a 250 Å thick thermal $SiO_2$ layer is formed by wet oxidation of the surface of the 1,200 Å polysi layer which will form layer 17 of island 18; approximately 100 Å of the polysi is converted to 250 Å of $SiO_2$. No other areas of the device at this stage except the island area are affected since they are masked by the 300 Å $Si_3N_4$ layer.

Following the above procedure, the 300 Å $Si_3N_4$ layer is removed by etching in hot phosphoric acid; the 250 Å thick $SiO_2$ layer grown by wet oxidation of the 1,200 Å polysi layer which will yield layer 17 in island 18 is not effected by this etch; following the above etch, the 1,200 Å polysi layer which will yield layer 17 of island 18 is exposed in all areas except at the island area which is, of course, protected by the 250 Å thick $SiO_2$ "mask".

Thereafter, RIE etching in $SF_6$ is conducted to remove the 1,200 Å polysi layer which will yield layer 17 of island 18 in all areas except the area where the island is to be formed which is, of course, protected by the 250 Å $SiO_2$ "mask". Following this procedure, at all areas other than the island area, the 10,000 to 12,000 Å CVD $SiO_2$ layer which will form layer 16 of island 18 is exposed.

This CVD $SiO_2$ layer is removed at all areas outside the island area by RIE etching of the CVD $SiO_2$ layer in $CF_4$—$H_2$ which exposes the underlying $Si_3N_4$ layer which will yield layer 15 of island 18, which is thereafter removed at areas outside the island area by RIE etching in $CF_4$—$H_2$.

The 250 Å $SiO_2$ mask on top of 1,200 Å polysi layer 17 is also removed during the conventional $CF_4$—$H_2$ RIE etch which removes the 10,000 to 12,000 Å CVD $SiO_2$ layer, whereby a structure as shown in FIG. 2 results.

As will be appreciated by one skilled in the art, viewed from above island 18 will have a square or rectangular shape. Thus, while the following explanation is generally given for cross-sectional views, it should be kept in mind that the processing steps exemplified also generally affect the areas of island 18 in the plane perpendicular the drawings.

It is to be specifically noted that the combination of thin $Si_3N_4$ layer 15 and doped CVD layer $SiO_2$ 16 provides unique benefits in that stresses during processing are reduced. If $Si_3N_4$ layer 15 and CVD $SiO_2$ layer 16 were replaced by a single $Si_3N_4$ layer, substantial edge stresses might be introduced during processing.

Figure 3:
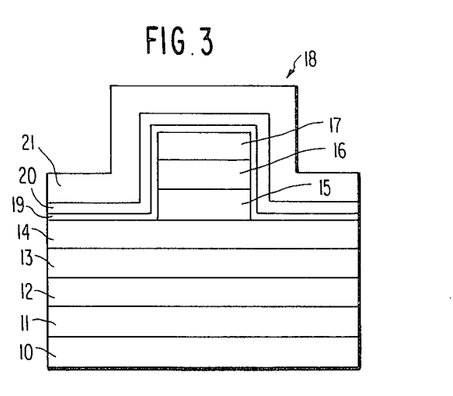

With reference to FIG. 3, following the above procedure 300 Å polysi layer 19, 500 Å $Si_3N_4$ layer 20 and 5,000 Å CVD $SiO_2$ layer 21 are grown using the procedures above described over the entire surface of the device. Each of these coatings are conformal and, of course, cover polysi layer 14 and island 18. The purpose of these layers is basically to protect the sidewall of island 18.

Figure 4:
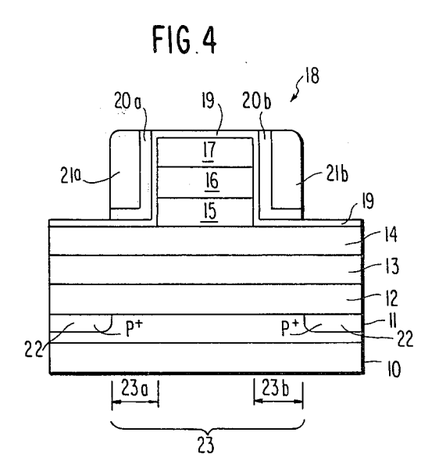

With reference to FIG. 4, firstly CVD $SiO_2$ layer 21 and then $Si_3N_4$ layer 20 are etched using a conventional RIE directional etch in $CF_4$—$H_2$, whereby all horizontal surfaces of CVD $SiO_2$ layer 21 and $Si_3N_4$ layer 20 are removed, leaving sidewall CVD $SiO_2$ zones 21a and 21b and sidewall $Si_3N_4$ zones 20a and 20b; since the directional etch does slightly erode the corners of the CVD $SiO_2$ layer 21, an arcuate shape is shown for CVD $SiO_2$ zones 21a and 21b. This directional etch results in an exposure of polysi layer 19 at all areas except the areas protected by CVD $SiO_2$ zones 21a and 21b and $Si_3N_4$ zones 20a and 20b. Polysi layer 19 remains for reasons which will later be apparent.

Following the above processing, a photoresist (Shipley AZ 1350J) is applied and the same is masked, exposed and developed (removed) in a conventional manner where the P+ contact 22 is formed. The photoalignment thereof is non-critical and serves as a means to prevent P+ doping on the collector contact area 103 shown in FIG. 18.

Following the above, a conventional boron implantation, e.g., at 90 to 100 Kev, dose: $5 \times 10^{15}$ atoms/cc, is conducted to yield P+ contact 22 in all areas except the area indicated by numeral 23 which is protected by CVD $SiO_2$ zones 21a and 21b (and $Si_3N_4$ sidewalls 20a and 20b), island 18 and the collector contact area 103 shown in FIG. 18. In this regard, the protected areas under the CVD $SiO_2$ zones and $Si_3N_4$ sidewalls are shown as 23a and 23b. Elements 23, 23a and 23b are shown only in FIG. 4 for purposes of explanation.

In the areas under CVD $SiO_2$ zones 21a and 21b the base access area of the bipolar transistor will eventually be formed and CVD $SiO_2$ zones 21a and 21b serve the primary purpose of protecting this area from high concentration boron implantation. In distinction, in other areas a heavy boron dope is conducted since this will ensure good electrical contact with the base contact (shown in FIG. 18). Island 18 comprising layers 15, 16 and 17 is, of course, sufficiently thick to prevent boron implantation into the area directly thereunder.

Figure 5:
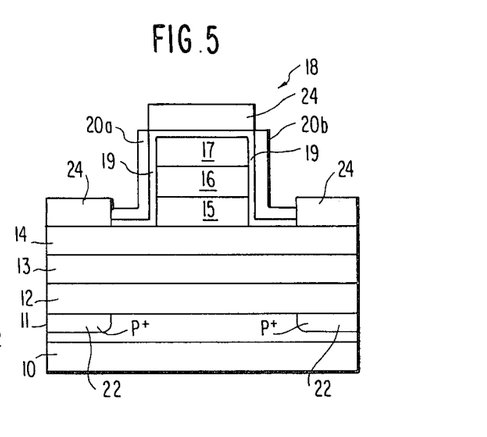

Following the above procedure, as illustrated in FIG. 5, firstly CVD $SiO_2$ zones 21a and 21b are removed using buffered HF in a conventional fashion, permitting $Si_3N_4$ sidewalls 20a and 20b to remain; the remainder of the device is not affected by the HF. Thereafter, polysi layers 14 and 19 are thermally oxidized at about 900° C. to form a thermal $SiO_2$ layer about 600 Å thick (which is inert to hot phosphoric acid) at all areas of the device except those areas protected by $Si_3N_4$ sidewalls 20a and 20b; the thermal $SiO_2$ is illustrated in FIG. 5 by numeral 24.

The device is then processed to have the configuration shown in FIG. 6 as follows.

Figure 6:
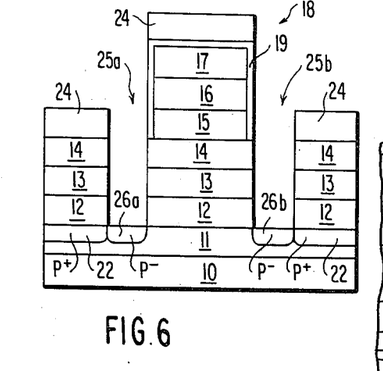

Firstly, the unprotected $Si_3N_4$ sidewalls 20a and 20b are removed in hot phosphoric acid, exposing the areas in FIG. 6 identified as 25a and 25b. This etch does not substantially affect thermal $SiO_2$ layer 24 covering polysi layer 14 and polysi layer 17.

Next, at areas 25a and 25b which are not protected by thermal $SiO_2$ layer 24, directional etching is conducted, e.g., RIE in $SF_6$ of polysi layers 19 and 14 is first conducted whereafter $Si_3N_4$ layer 13 is removed in hot phosphoric acid at areas 25a and 25 and then polysi layer 12 is removed by RIE in $SF_6$.

Following the above procedure, a low dose 5 KeV boron implant is conducted in a conventional fashion to a concentration of $5 \times 10^{11}$ to $5 \times 10^{12}$ atoms/cc at areas 25a and 25b to result in P− zones being formed in N− epi layer 11, as identified by numerals 26a and 26b.

Thermal SiO$_2$ layer 24 and polysi layer 14 prevent boron implantation into the balance of the device.

The RIE which provides the device illustrated in FIG. 6 where thermal SiO$_2$ layer 24 is used as a mask provides an essentially self-aligned base structure, as will later be apparent, without the use of a photolithographic step which can introduce the inaccuracy heretofore discussed.

In this regard, if reference is made to FIG. 3 and FIG. 4, it is seen that CVD SiO$_2$ layer 21 is formed in a conventional fashion; the thickness of such a layer upon deposition can be controlled in a highly precise manner using conventional techniques in the art, as can the thickness of Si$_3$N$_4$ layer 20.

In a similar fashion, the degree of etching or degree of CVD SiO$_2$ and Si$_3$N$_4$ removal which leads to the device as shown in FIG. 4 can be easily controlled in a highly reproducible fashion, i.e., the exact location of areas 22 and 23 as shown in FIG. 4 can be easily controlled by conventional deposition/etching techniques.

Thus, since thermal SiO$_2$ layer 24 directly abuts Si$_3$N$_4$ sidewalls 20a and 20b as shown in FIG. 5, when the diffusion of P$^-$ pockets 26a and 26b shown in FIG. 6 is accomplished, extremely precise location of P$^-$ pockets 26a and 26b is obtained without the need for photolithographic alignment.

For example, if one was to form P$^-$ pockets twice as wide as those represented by 26a and 26b in FIG. 6, instead of using a 5,000 Å CVD SiO$_2$ layer 21, a 10,000 Å CVD SiO$_2$ layer would be used which, upon etching, would provide CVD SiO$_2$ areas 21a and 21b as shown in FIG. 4 and, of course, Si$_3$N$_4$ sidewalls 20a and 20b as shown in FIG. 4, essentially twice as wide as shown in FIG. 4.

Thus, by following the procedure of FIGS. 1-6, a device as shown in FIG. 6 is obtained having P$^-$ diffusions placed in a highly accurate fashion which will eventually delineate the emitter-base region of a bipolar transistor.

Figure 7:
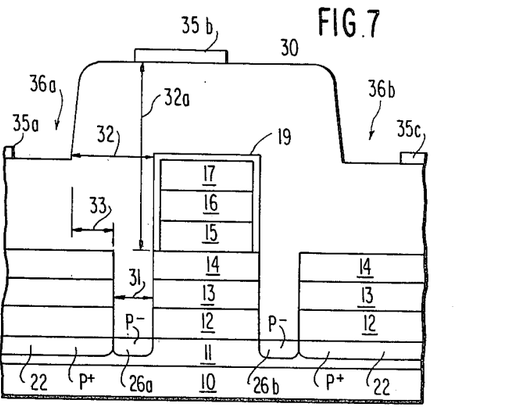

Following the procedure of FIG. 6, a low pressure CVD SiO$_2$ oxide deposition is conducted over the entire surface of the device to grow CVD SiO$_2$ oxide layer 30 as shown in FIG. 7. For purposes of simplicity, since there is no difference of substance in characteristics between layer 30 and layer 24, these are merely shown as merged into layer 30 in FIG. 7. The total thickness of CVD SiO$_2$ layer 30 is approximately 8,000-10,000 Å, and this will result in a second inherently self-aligning procedure as now will be explained.

Referring to FIG. 7, which shows the device after growth of the CVD oxide layer 30, it is to be specifically noted that since CVD oxide layer 30 is conformal and dimension 32 exceeds dimension 31, i.e., exceeds the dimension of the gap which has been etched to the N$^-$ epi layer 11 at areas 25a and 25b shown in FIG. 6, it is necessary that CVD SiO$_2$ layer 30 extend a distance 32 which is greater than distance 31. This is a critical aspect of the present invention since the difference between dimension 32 and 31 as represented by numeral 33 in FIG. 7 will eventually be the area of formation of a P$^-$ isolation ring of high placement accuracy around the base and emitter of a bipolar transistor.

Since dimension 33 will typically be on the order of, e.g., 0.35 to 0.55 micron, even if there is a slight error in the isolation placement, the device cannot be adversely effected since dimension 32 is greater than dimension 31, and with the accurate control inherent in CVD SiO$_2$ deposition, dimension 33 can be freely selected in a highly accurate fashion to insure that the emitter and base of the bipolar transistor will not be contacting the isolation, even if a photolithographic step is used at this stage of the process of the present invention. Thus, any misalignment will be shifted from the emitter area where placement is critical, to the isolation area where placement is relatively non-critical.

As shown in FIG. 7, nextly a conventional photoresist such as Shipley AZ 1350 J is applied to CVD SiO$_2$ layer 30 and masked, exposed and developed in a conventional manner to provide annular, rectangular photoresist protected areas as represented by numerals 35a, 35b and 35c in FIG. 7. Of course, it is desired that masking, exposure, etc., be as precise as possible, though misalignment within alignment tolerance is acceptable.

As can be seen from FIG. 7, in the area represented by numeral 32a the depth of the CVD SiO$_2$ layer 30 is very thick; thus, when RIE is conducted, areas protected by photoresist as represented by 35a, 35b and 35c will not be etched and due to the greater thickness of the oxide at 32a etching will not be complete at this area, rather, etching will proceed down to poly layer 14 only at areas 36a and 36b as indicated by the arrows in FIG. 7. The P+ doping which was introduced by implantation at areas 36a and 36b after island delineation as shown in FIG. 7 is important in that it provides low resistance base access to the device.

Figure 8:
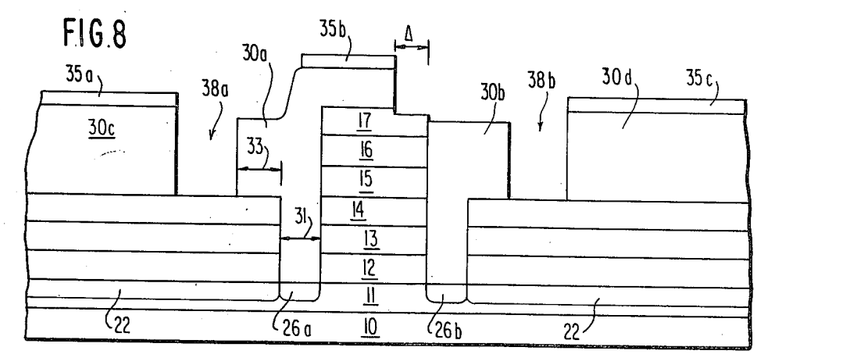

With respect to FIG. 7, CVD SiO$_2$ layer 30 is nextly subjected to RIE in CF$_4$—H$_2$ and CVD SiO$_2$ layer 30 is thus etched at all areas except those areas protected by photoresist 35a, 35b and 35c but is not completely etched in those areas where CVD SiO$_2$ layer 30 has thickness 32a, leaving, as shown in FIG. 8, CVD SiO$_2$ area 30c and 30d under photoresist layers 35a and 35c, respectively, and CVD SiO$_2$ areas 30a and 30b which have a depth of about 15,000 Å, dimensions 31 and 33 being, respectively about 0.5μ and 0.3μ, of course, since the RIE does not substantially affect these dimensions. From above, the photoresist layout resembles a central "castle" 35b surrounded by a "moat"—38a and 38b with complementary areas behind and in front of the plane of FIG. 8—which is bounded by photoresist 35a and 35c—again with complimentary areas behind and in front of the plane of FIG. 8.

It is to be specifically noted that following the above procedure areas 38a and 38b are formed where the polysi layer 14 is exposed as shown in FIG. 8.

It can be seen that since dimension 33 as shown in FIG. 8 can be accurately controlled by the combination of CVD and RIE, that if there is any error in the photoresist step which results in the formation of photoresist areas 35a, 35b and 35c that nonetheless, as will later be clear, the location of the base and emitter of the transistor will not be affected, rather, if there is any error it will be in the area where the deep trenches will be formed as will later be explained for FIG. 9.

If any misalignment during photoresist exposure occurs, in the above procedure, this will occur at the area indicated by Δ in FIG. 8 (obviously the Δ can occur at the other side of island 18 but the effect of shifting much misalignment into one deep trench or the other is the same). Assuming such misalignment occurs, then during removal of CVD SiO$_2$ layer 30 the only result will be a partial etch into polysi layer 17 as shown at the Δ area in FIG. 8 with a corresponding shift of deep trench 47b shown in FIG. 9 a corresponding Δ measurement. This concept, central to the invention, is illustrated in more detail in FIG. 18. Obviously the thickness of polysi layer 17 must thus be correlated with etch conditions, but such can easily be done by one skilled in the art given the illustrative values above.

Figure 9:
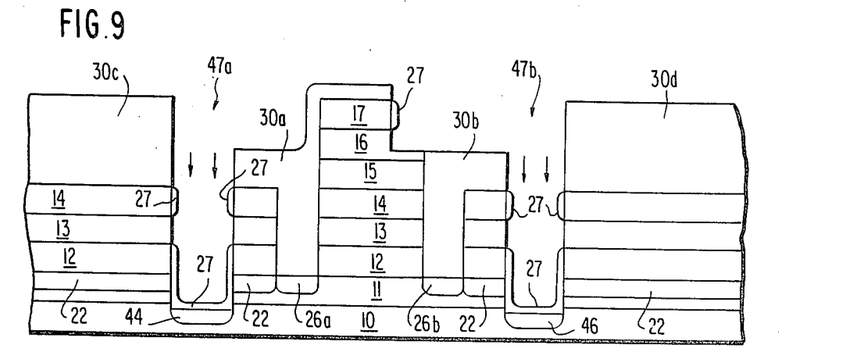

Note also that if theoretical deep trench width is represented by "1", deep trench width 47a in FIG. 9 would be "1" plus Δ minus the sum of the $P^+$ and $P^-$ ring spacings but deep trench 47b shown in FIG. 9 would have a width of "1" minus Δ minus the sum of the $P^+$ and $P^-$ ring spacings.

Referring now to FIG. 9, following the above procedure firstly photoresist is removed by, e.g., $O_2$ plasma etch, whereafter deep trench formation is conducted in the unprotected areas between CVD $SiO_2$ depositions 30a, 30b, 30c and 30d whereafter deep trenches 47a and 47b result. For example, polysi layer 14 is removed by RIE in $SF_6$, $Si_3N_4$ layer 13 is removed in hot phosphoric acid, polysi layer 12 is removed by RIE in $SF_6$ and 4μ of the silicon thereunder removed by the same procedure, all in a conventional fashion.

Nextly, oxide layer 27 (500~1,000 Å) is thermally grown at 1000° C. in $O_2$ and steam on exosed polysi and silicon to mask against sideward boron implantation. Then deep trench boron implantation, as shown by the arrows in FIG. 9, is conducted to form P isolation pockets 44 and 46 in $P^-$ substrate 10, e.g., using a conventional ion implanter at 5~30 KeV to provide a boron concentration of $10^{13}$ to $5 \times 10^{15}$ atoms/cc. P isolation pockets 44 and 46 ensure the N epi layer 11 is appropriately isolated.

Figure 10:
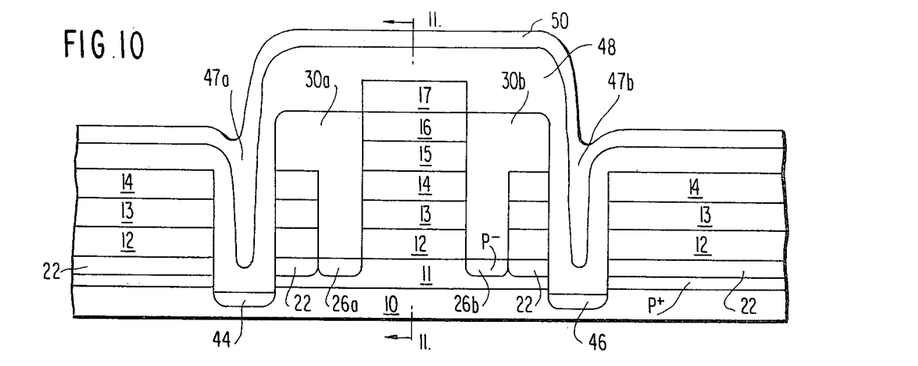

Referring now to FIG. 10, a 4,000 to 5,000 Å $SiO_2$ layer 48 is formed over the entire surface of the device by low pressure CVD deposition. Although CVD $SiO_2$ layers 30a and 30b are shown in FIG. 10 as distinct from layer 48, chemically their identity is similar. CVD $SiO_2$ layers 30c and 30d are, for simplicity, shown merged with layer 48.

Figure 11:
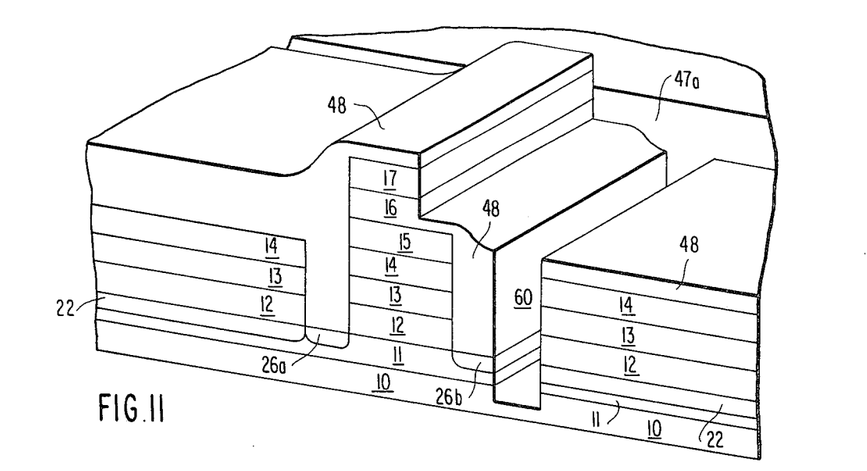

Still referring to FIG. 10, nextly a conventional photoresist such as Shipley AZ 1350 J is applied to the entire surface of the device to provide photoresist layer 50, whereafter the photoresist is masked, exposed and developed in a conventional manner to remove photoresist at the areas where a shallow trench is to be formed, which procedure is explained with respect to FIG. 11. As one skilled in the art will appreciate, the shallow trenches are used for contact—not device—isolation, and thus are typically at a 90° angle to the deep trenches.

As one skilled in the art will further appreciate, FIG. 10 is not to scale since the trenches 47a and 47b are deep wide trenches and will be much wider than shown, e.g., can have a depth on the order of 4 microns and a width of 5 to 10 microns up to 100 microns. Thus, layers 48 and 50 will not actually fill the trenches, rather, will "indent" at the areas of the trenches. This phenomenon is well known in the art, and is thus merely schematically illustrated in FIG. 10.

Referring to FIG. 11, FIG. 11 is a 90° rotation of the device shown in FIG. 10 with the device shown in perspective for clarity. As is illustrated in FIG. 10, FIG. 11 is essentially a perspective view of the device viewed from the direction of the arrows shown in FIG. 10. The $P^+$ and $P^-$ diffusions around the island shown in earlier Figures are not shown in FIGS. 11-16 and 18 for simplicity.

With respect to FIG. 11, this represents the device after the photoresist layer 50 illustrated in FIG. 10 has been masked, exposed and developed to expose the area over shallow trench 60, whereafter CVD $SiO_2$ layer 48 is removed in areas not protected by photoresist by $CF_4$—$H_2$ RIE etching, whereafter the photoresist layer is stripped by an $O_2$ plasma etch. At this stage remaining $SiO_2$ layer 48 serves as a mask so that polysi layer 14, $Si_3N_4$ layer 13, polysi layer 12 and epi layer 11 are removed in unprotected areas using RIE etch procedures as earlier described, whereafter shallow trench 60 is formed to a depth of about 1μ in the substrate 10 using the procedures as earlier explained for deep trench formation, one deep trench 47a being shown in FIG. 11 for purposes of illustration. Shallow trench 60 does not, of course, extend through the subcollector (not shown).

As will be appreciated by one skilled in the art, shallow trench 60 actually connects deep trench 47a and deep trench 47b, deep trench 47b being just forward of the plane of FIG. 11. Also, since shallow trench 60 will extend somewhat into the deep trenches, as exemplified by 47a in FIG. 11, while the deep trenches are typically etched to a depth of about 3.5 microns and the shallow trenches are etched to a depth of about 1.0 micron, the areas where shallow trench 60 overlaps deep trench 47a will be etched to a somewhat greater depth, for example, on the order of a total of 4.5 microns. This causes no problems since a deep trench such as 47a is very wide in the context of overall device measurements.

It is to be specifically noted that doped $SiO_2$ layer 16 as shown in FIG. 11 serves to protect underlying layers during etching; thus, since no doped $SiO_2$ layer exists in the area of shallow trench 60, and $SiO_2$ layer protects the balance of the device, etching is conducted only in the area where shallow trench 60 is to be formed.

Figure 12:
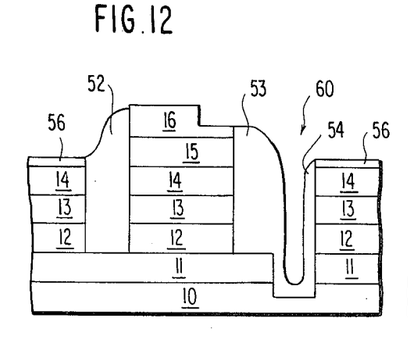

Referring now to FIG. 12, FIG. 12 is a front view of the device of FIG. 11 after the processing now to be described. Deep trenches are, of course, not shown since these are out of the plane of FIG. 12, i.e., beyond the drawing on either side. For simplicity, various $P^+$ and $P^-$ implants as shown in earlier Figures are not identified in FIGS. 12-16 and 18; suffice it to say they remain essentially unchanged except where a subsequent implant occurs or a post-implant anneal is conducted, procedures whose effects will be apparent to one skilled in the art.

Firstly, 3,000~5,000 Å $SiO_2$ layer 48 which is etched back during the 1μ trench formation by at least 1,200 Å as shown in FIG. 11 is removed by a conventional $CF_4$—$H_2$ RIE etch back to leave CVD $SiO_2$ sidewalls 52, 53 and 54 with a small amount of $SiO_2$ being formed between sidewalls 53 and 54 in trench 60. As will be appreciated by one skilled in the art, the RIE etch back is a directional etch, and thus while exposed horizontally oriented areas of $SiO_2$ layer 48 are removed, those areas which present a substantial vertical rise are not substantially etched. The purpose of these sidewalls is to protect the walls on which they are formed.

Following the above $CF_4$—$H_2$ RIE back etch, polysi layer 14 and polysi layer 17 are subjected to a conventional polysi etch; whereas polysi layer 17 is removed, polysi layer 14, due to its greater thickness, is not completely removed. For example, after the removal of polysi layer 17, approximately 1,800 Å of polysi layer 14 will remain.

Figure 13:
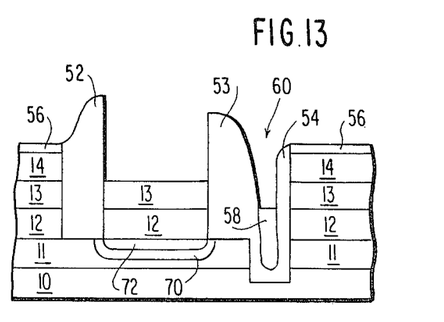

Referring now to FIG. 13, following the above procedure doped $SiO_2$ layer 16 is removed. Since this $SiO_2$ layer is doped, the doped $SiO_2$ layer 16 will be removed at a rate approximately 10 times as fast as undoped $SiO_2$ present. Thus, doped $SiO_2$ layer 16 is preferentially etched at 20 Å/second. Thus, $Si_3N_4$ layer 15 in the emitter island area is exposed. Following the above procedure, the 1,800 Å thick layer of polysi 14 is thermally oxidized in a conventional fashion to yield a 600 Å layer of thermal SiO$_2$ 56, which of course, will further reduce the thickness of polysi layer 14 to about 1,500 Å.

Following the above, now unprotected Si$_3$N$_4$ layer 15 in the emitter island area is removed in hot H$_3$PO$_4$ and now unprotected polysi layer 14 in the emitter island area is removed by a conventional polysi etch, whereafter the device is coated with a conventional photoresist such as Shipley AZ 1350 J and, by a conventional O$_2$ plasma etch back, photoresist plug 58 shown in FIG. 13 is formed which provides trench protection, i.e., photoresist is etched back in areas other than the trench without a masking step.

It should be noted that the SiO$_2$ and photoresist as shown in FIG. 13 are essentially impervious to ion implantation, whereas conventional impurities used to form a transistor emitter and base such as boron and arsenic can be driven through the thin Si$_3$N$_4$ layer 13 and poly layer 12 into N epi layer 11; accordingly, following a conventional boron implantation at 5 to 10 KeV to a dose of $2 \times 10^{14}$ atoms/cm$^2$, what will be transistor base 70 shown in FIG. 13 results. With a subsequent conventional implantation of aresenic at 30 to 40 KeV to a dose of $2 \times 10^{15}$ atoms/cc, transistor emitter 72 as shown in FIG. 13 results.

Following processing to obtain a device as shown in FIG. 13, photoresist plug 58 is removed with a stripper and a conventional drive-in heating at 900° C. for 45 minutes in O$_2$ and 950° C. for 30 minutes in N$_2$ conducted. The photoresist is removed since it could degrade at drive-in temperatures.

It is to be noted that in accordance with the present invention isolation is formed after emitter-base alignment. This is a valuable feature of the present invention as if isolation is performed before base and emitter formation, as per a typical prior art process, typically high stresses are introduced into the device during such processing, a situation avoided per the present invention.

Figure 14:
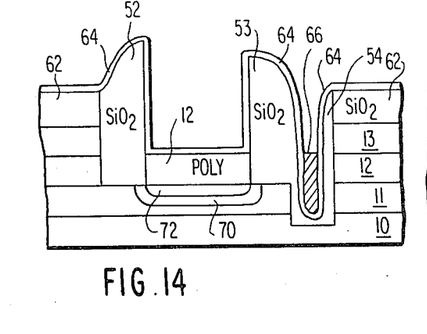

Following the above procedure, as illustrated with respect to FIG. 14, those areas of polysi layer 14 which remain are thermally oxidized in a conventional manner to provide SiO$_2$ layer 62 as shown in FIG. 14 which is approximately 2,000-4,000 Å thick and which includes SiO$_2$ layer 56 which is omitted in FIG. 14 for brevity.

Thereafter, unprotected Si$_3$N$_4$ layer 13 is removed in a conventional fashion using hot phosphoric acid, thereby exposing unprotected polysi layer 12. Following the above procedure, a thin Si$_3$N$_4$ layer, on the order of 500 Å, is then deposited in a conventional manner to provide layer 64 as shown in FIG. 14. Layer 64 is, of course, conformal.

Still referring to FIG. 14, as illustrated therein a polyimide isolation as represented by numeral 66 can be performed by applying any conventional polyimide material such as Monsanto Skybond then etching back in O$_2$ plasma at room temperature. It is to be noted that in those instances where device isolation is performed using a polyimide, mechanical stresses near the side wall all are considerably reduced. Further, polyimides have excellent planarization capability, a technique known in the art. Since polyimides have a lower dielectric constant than SiO$_2$, device performance is boosted. It should specifically also be noted that polysi layer 12 which remains assists to avoid $\beta$ degradation by preventing direct metallurgy contact with the silicon emitter.

Figures 15, 18:
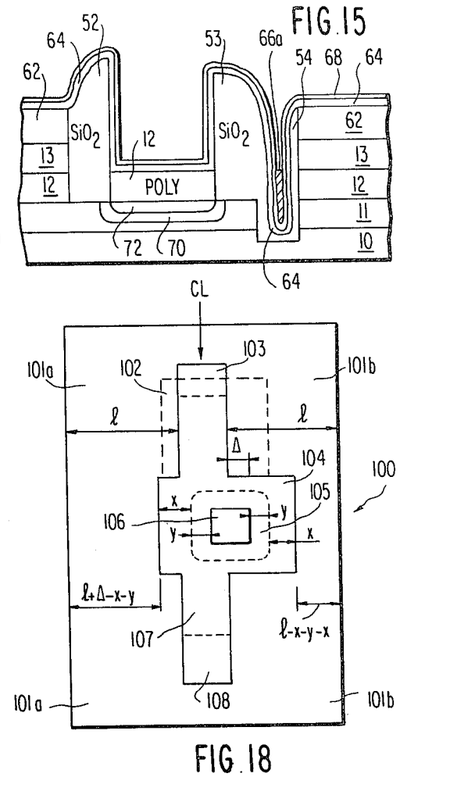
FIG. 18 is a schematic upper view illustrating the self-alignment feature of the present invention.

In a further embodiment, the device of FIG. 13 is processed to the stage illustrated in FIG. 14 just prior to polyimide isolation; instead of polyimide isolation, after Si$_3$N$_4$ layer 64 is formed, nextly polysi layer 68 as shown in FIG. 15 is formed by CVD from a silane-argon atmosphere to a thickness of 1,000 Å, whereafter CVD SiO$_2$ or spin-on glass isolation 66a is formed in a conventional manner in the shallow trench and deep trenches. As one skilled in the art will appreciate, of course, since CVD SiO$_2$ or spin-on glass will be coated over the entire surface of the device, in essence the CVD SiO$_2$ or spin-on glass in areas other than the shallow trench and deep trench will be removed by a conventional timed CF$_4$—H$_2$ etch back.

The purpose of polysi layer 12 in the emitter island area during the above processing steps is, of course, to protect the polysi emitter 72 shown in FIG. 13 et seq.

Figure 16:
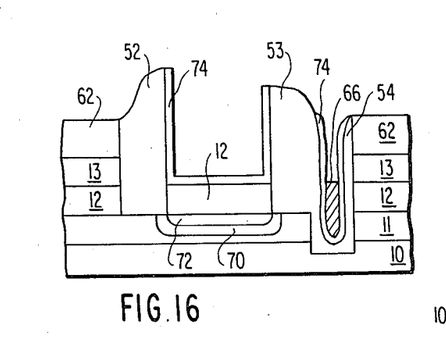

Referring now to FIG. 16, which is used for simplicity to illustrate a further processing of the embodiments of FIGS. 14 and 15, and taking FIG. 14 and processing the same to FIG. 16, the next step is to remove the horizontal areas of Si$_3$N$_4$ layer 64 by a conventional timed CF$_4$—H$_2$ RIE, thereby leaving only Si$_3$N$_4$ sidewalls 74 as shown in FIG. 16 with a slight amount of Si$_3$N$_4$ joining the sidewalls.

The embodiment of FIG. 15 would be processed in a similar fashion except that first polysi layer 68 would be removed by a Cl$_2$/Ar RIE etch with the ends of the polysilicon at the trench sidewalls being thermally oxidized, whereafter Si$_3$N$_4$ layer 64 would be removed by a conventional timed CF$_4$—H$_2$ RIE at the conditions earlier given, resulting in a device identical to that shown in FIG. 16 except that a thin sidewall of polysi would overlie Si$_3$N$_4$ sidewalls 74 where such sidewalls are present.

Figure 17:
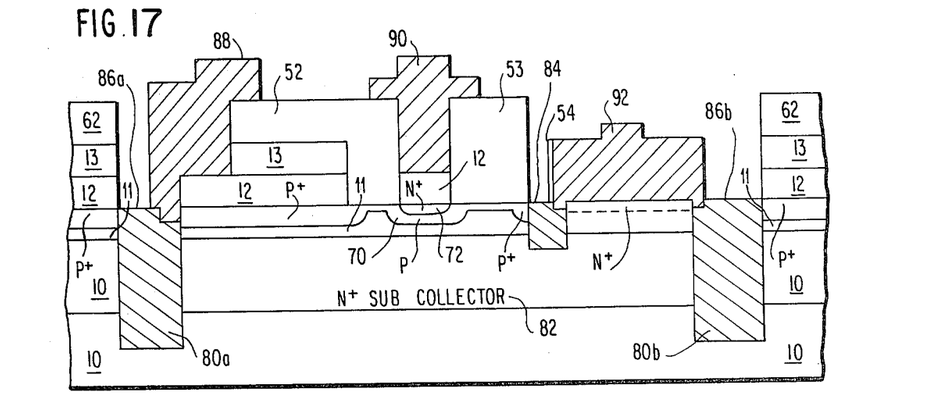

Again continuing with the explanation of the invention as given with respect to FIG. 16, and keeping in mind that if the embodiment of FIG. 15 were processed polysi sidewalls would be present over the Si$_3$N$_4$ sidewalls 74 as shown in FIG. 16, a device as shown in FIG. 17 results.

With respect to FIG. 17, it is to be noted, as will be understood by one skilled in the art, that deep trenches essentially encircle and isolate a device. Thus, with reference with FIG. 17, deep trenches 47a and 47b are not shown since these are, of course, outside the plane of FIG. 17; however, deep trenches 80a and 80b are shown therein. Deep trenches 80a and 80b essentially run at 90° angles to, and intersect, deep trenches 47a and 47b.

Turning to FIG. 17 in detail, like numerals are used therein to identify elements shown in FIGS. 1–16, i.e., substrate 10, N epi 11, poly layer 12, Si$_3$N$_4$ layer 13 and SiO$_2$ layer 62 and SiO$_2$ sidewalls 52, 53 and 54. Various P+, p and n+ implants are generally shown in FIG. 17 for illustrative purposes.

Also shown in FIG. 17 is N+ subcollector 82 which, as earlier indicated, is formed just prior to the formation of N epi layer 11, shallow trench 60 filled with dielectric isolation 84, and deep trenches 80a and 80b filled with a similar dielectric isolation 86a and 86b, respectively. For purposes of simplicity, layers such as Si$_3$N$_4$ layer 74 as illustrated in FIG. 16 are not shown in FIG. 17.

In the device as shown in FIG. 17, the base contact is represented by numeral 88, the emitter contact is represented by numeral 90 and the collector contact is represented by numeral 92.

Referring now to FIG. 18, this is a simplified upper view of a schematic of a typical device as formed per the present invention where various diffusion areas, etc., are omitted for purposes of explanation. However, it is believed that one skilled in the art will easily be able to correlate the concepts illustrated in FIG. 18 with the concepts discussed earlier, albeit the schematic of FIG. 18 omits elements earlier mentioned and adds elements not earlier mentioned (which are conventional) for ease of explanation.

With reference to FIG. 18, the semiconductor surface is generally indicated by numeral 100.

Deep trenches are represented by numerals 101a and 101b in FIG. 18.

Shallow trench 102 is shown in FIG. 18, shallow 102 effecting transistor element isolation as shown.

Also shown in FIG. 18 is a conventional P+ contact area 108.

Numeral 104 in FIG. 18 represents a P+ isolation ring.

Also shown in FIG. 18 is P− diffusion zone 105.

The emitter base island is represented by 106 in FIG. 18.

As one skilled in the art will appreciate, the P+ isolation ring 104 will also extend to area 107 as shown in FIG. 18 with the base contact at location 108. Lying under shallow trench 102 is N− epi collector contact 103.

Certain measurements as reflected by l, y, x and Δ are also shown in FIG. 18.

Viewed from above, measurement Δ reflects the misalignment which might occur during deep trench formation as represented by Δ in FIG. 8. As shown in FIGS. 8 and 18, any misalignment during the photolithographic step will be compensated for by an "offset" of the emitter-base island from the theoretical desired centerline—shown in CL in FIG. 18-into deep trench 101b; however, despite the Δ misalignment, the device (transistor) will always be symmetrical and the emitter/base will never contact the isolation.

Thus, any misalignment of the emitter-base island 106 from the true center line CL in FIG. 18 will be compensated for by deep trench 101b being reduced in width by measurement Δ+x+y on one side and by x+y−Δ on the other side. So long as trench width is greater than Δ, any misalignment per the process of the present invention is thus inherently compensated for.

While the invention has been described in detail and with reference to specific embodiments thereof, it will be apparent to one skilled in the art that various changes and modifications can be made therein without departing from the spirit and scope thereof.

What is claimed is:

1. A method of forming self-aligned dielectric isolation in a semiconductor silicon substrate comprising:
   (a) forming an epitaxial layer on said substrate;
   (b) forming a polysilicon layer over said epitaxial layer;
   (c) forming an ion implantation masking rectangular island on said polysilicon layer;
   (d) forming ion implantation masking side walls on said diffusion-resistant rectangular island;
   (e) implanting a first impurity into areas not covered by said island or said side walls;
   (f) forming an ion implantation masking layer on said silicon substrate at areas other than at said diffusion-resistant side walls and abutting said side walls;
   (g) removing said side walls;
   (h) implanting a second impurity only in the area where said side walls were removed, said island and said masking layer preventing implantation into areas other than where said side walls were removed;
   (i) etching a gap through said polysilicon layer at the areas where side walls were removed;
   (j) covering the surface of said device with an etchable dielectric material, which etchable dielectric material also covers said exposed silicon layer;
   (k) selectively masking and then removing said etchable dielectric material in areas other than in said island, said gap, and an area contiguous to said gap, whereby said etchable dielectric material is removed in a prospective deep trench area surrounding but spaced from said gap by said area contiguous said gap;
   (l) etching a deep trench into said silicon substrate where said etchable dielectric material was removed from said prospective deep trench area, said deep trench being spaced from said island by said gap and said area contiguous to said gap;
   (m) implanting a third impurity into said deep trench;
   (n) filling said deep trench with a dielectric isolation material.

2. The method of claim 1, wherein the masking of step (k) is a photolithographic masking which results in photoresist over at least a portion of said island and over the area immediately outside said prospective deep trench area.

3. The method of claim 2, wherein said island comprises, in sequence from said substrate, a lower $Si_3N_4$ layer, a doped $SiO_2$ layer and an upper polysi layer, wherein during formation of said prospective deep trench area if said misalignment occurs said island unprotected by photoresist is not removed beyond said doped $SiO_2$ layer.

4. The method of claim 3, wherein said etchable dielectric material is conformal to all surfaces on which it is formed, whereby it has a thickness over said island, said gap and said area contiguous said gap so that upon removal thereof from said prospective deep trench area said etchable dielectric material still remains over said island, said gap, and said area contiguous said gap.

5. The method of claim 4, wherein as said deep trench is filled with said dielectric isolation material in step (n) the entire surface of the device is coated with said dielectric isolation material, which is etchable.

6. The method of claim 5, wherein said dielectric isolation material is further coated with a photoresist which is selectively removed in an area at substantially a 90° angle to said deep trench, whereafter a shallow trench of a lesser depth than said deep trench is etched into said epitaxial layer at the area wherein said photoresist was removed.

7. The method of claim 3, wherein said upper $Si_3N_4$ layer and said doped $SiO_2$ layer of said island are removed, whereafter said second polysilicon layer and said $Si_3N_4$ layer under said island are removed to expose said polysilicon layer under said island, whereafter transistor emitter and base implantations are conducted through said polysilicon layer.

8. The method of claim 7, wherein there is formed over said polysilicon layer and under said island, in sequence, a $Si_3N_4$ layer and a second polysilicon layer, said island being formed on said second polysilicon layer.

9. The method of claim 8, wherein said sidewalls comprise in a third polysilicon layer, an $Si_3N_4$ layer and an area of $SiO_2$ over said $Si_3N_4$ layer.

10. The method of claim 9, wherein said first, second and third impurities implanted are boron.

* * * * *